United States Patent
Seok

(10) Patent No.: US 10,014,852 B2
(45) Date of Patent: *Jul. 3, 2018

(54) HIGH-VOLTAGE STACKED TRANSISTOR CIRCUIT

(71) Applicant: IXYS, LLC, Milpitas, CA (US)

(72) Inventor: Kyoung Wook Seok, Milpitas, CA (US)

(73) Assignee: IXYS, LLC, Milpitas, CA (US)

( * ) Notice: Subject to any disclaimer, the term of this patent is extended or adjusted under 35 U.S.C. 154(b) by 5 days.

This patent is subject to a terminal disclaimer.

(21) Appl. No.: 15/421,405

(22) Filed: Jan. 31, 2017

(65) Prior Publication Data

US 2017/0346480 A1   Nov. 30, 2017

Related U.S. Application Data

(63) Continuation of application No. 15/169,526, filed on May 31, 2016, now Pat. No. 9,595,950.

(51) Int. Cl.
*H03K 3/00* (2006.01)
*H03K 17/10* (2006.01)

(52) U.S. Cl.
CPC .................. *H03K 17/107* (2013.01)

(58) Field of Classification Search
None
See application file for complete search history.

(56) References Cited

U.S. PATENT DOCUMENTS

| 8,743,516 B2* | 6/2014 | Gill ......................... H02H 9/041 361/56 |
| 9,595,950 B1* | 3/2017 | Seok ................ H03K 17/08122 |
| 2013/0175704 A1 | 7/2013 | Jeun et al. ..................... 257/777 |
| 2015/0028922 A1* | 1/2015 | Turkson ............... H03K 17/145 327/109 |

OTHER PUBLICATIONS

Xiao et al., "A 10kV/200A SiC MOSFET Module with Series—Parallel Hybrid Connection of 1200V/50A Dies," IEEE Proc. of 27th Int'l Symposium on Power Semiconductor Devices, May 10-14, 2015, Hong Kong, pp. 349-352 (4 pages).
Founds et al., "High-Voltage Series MOSFET Output Driver for Nanometer Technologies," Univ. of Idaho and Cypress Semiconductor, no date (4 pages).

* cited by examiner

*Primary Examiner* — Long Nguyen
(74) *Attorney, Agent, or Firm* — Imperium Patent Works; T. Lester Wallace; Darien K. Wallace

(57) ABSTRACT

A High-Voltage Stacked Transistor Circuit (HVSTC) includes a stack of power transistors coupled in series between a first terminal and a second terminal. The HVSTC also has a control terminal for turning on an off the power transistors of the stack. All of the power transistors of the stack turn on together, and turn off together, so that the overall stack operates like a single transistor having a higher breakdown voltage. Each power transistor, other than the one most directly coupled to the first terminal, has an associated bipolar transistor. In a static on state of the HVSTC, the bipolar transistors are off. The associated power transistors can therefore be turned on. In a static off state of the HVSTC, the bipolar transistors are conductive (in one example, in the reverse active mode) in such a way that they keep their associated power transistors off.

20 Claims, 9 Drawing Sheets

HIGH-VOLTAGE STACKED TRANSISTOR CIRCUIT

ONE EXAMPLE OF AN APPLICATION CIRCUIT INVOLVING A
HIGH-VOLTAGE STACKED TRANSISTOR CIRCUIT

FOUR-TERMINAL PACKAGED HVSTC

HIGH-VOLTAGE STACKED TRANSISTOR CIRCUIT

STATIC ON STATE

STATIC OFF STATE

HIGH-VOLTAGE STACKED TRANSISTOR CIRCUIT

HIGH-VOLTAGE STACKED TRANSISTOR CIRCUIT

CROSS REFERENCE TO RELATED APPLICATIONS

This application is a continuation of, and claims priority under 35 U.S.C. § 120 from, nonprovisional U.S. patent application Ser. No. 15/169,526 entitled "High-Voltage Stacked Transistor Circuit," filed on May 31, 2016, now U.S. Pat. No. 9,595,950, the subject matter of which is incorporated herein by reference.

TECHNICAL FIELD

The described embodiments relate to power semiconductor devices.

BACKGROUND INFORMATION

In certain circuit applications, a power Field Effect Transistor (FET) switch is needed that can withstand a very high voltage between its drain and source terminals. The high voltage may be a voltage higher than any available power FET can withstand. Several different stacked circuits are known in which multiple power FETs are connected in a "stacked" or "chained" fashion. The drain of a power FET of the stack is coupled to the source of the power FET next higher in the stack. If all the power FETs of the stack are off, then a high voltage present across the entire stack may be shared more or less equally by the various power FETs. Due to this voltage divider effect, each power FET sees a lower $V_{DS}$ voltage between its drain and source terminals. During switching of the overall circuit, if all the power FETs of the stack are turned on at the same time, then no one of the power FETs during turn on of the overall circuit will experience a $V_{DS}$ drain-to-source voltage higher than its drain-to-source breakdown voltage ($BV_{DS}$). Likewise, during switching of the overall circuit, if all the power FETs are turned off at the same time, then no one of the power FETs during turn off of the overall circuit will experience a drain-to-source voltage higher than its drain-to-source $BV_{DS}$ breakdown voltage.

SUMMARY

A High-Voltage Stacked Transistor Circuit (HVSTC) includes a stack of power transistors (for example, power N-channel enhancement-mode field effect transistors) coupled in series between a first terminal S and a second terminal D. The HVSTC also has a control input terminal G for receiving an input control signal. In response to a level of the input control signal on the input terminal G, the transistors of the stack are either turned on or are turned off. All of the power transistors of the stack are controlled to turn on together, and to turn off together, so that the overall stack operates like a single transistor having a higher breakdown voltage between the first and second terminals than any of its constituent power transistors. Each power transistor of the stack, other than the one coupled most directly to the first terminal S, has an associated bipolar transistor. In response to the input control signal being at a high voltage level (for example, ten volts with respect to first terminal S), the bipolar transistors are off, and the HVSTC is in a static on state. Because the bipolar transistors are off, the associated power transistors can be turned on in response to the input control signal. In response to the input control signal being at a low voltage level (for example, zero volts with respect to first terminal S), the HVSTC is in a static off state. The bipolar transistors are conductive (in one example in the reverse active mode) in such a way that they keep their associated power transistors off.

Further details and embodiments and techniques are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

FIG. 6A is a waveform diagram that illustrates operation of the HVSTC of FIG. 2 when the circuit is turning on.

FIG. 6B is a waveform diagram that illustrates operation of the HVSTC of FIG. 2 when the circuit is turning on.

DETAILED DESCRIPTION

Reference will now be made in detail to background examples and some embodiments of the invention, examples of which are illustrated in the accompanying drawings.

Figure 1:
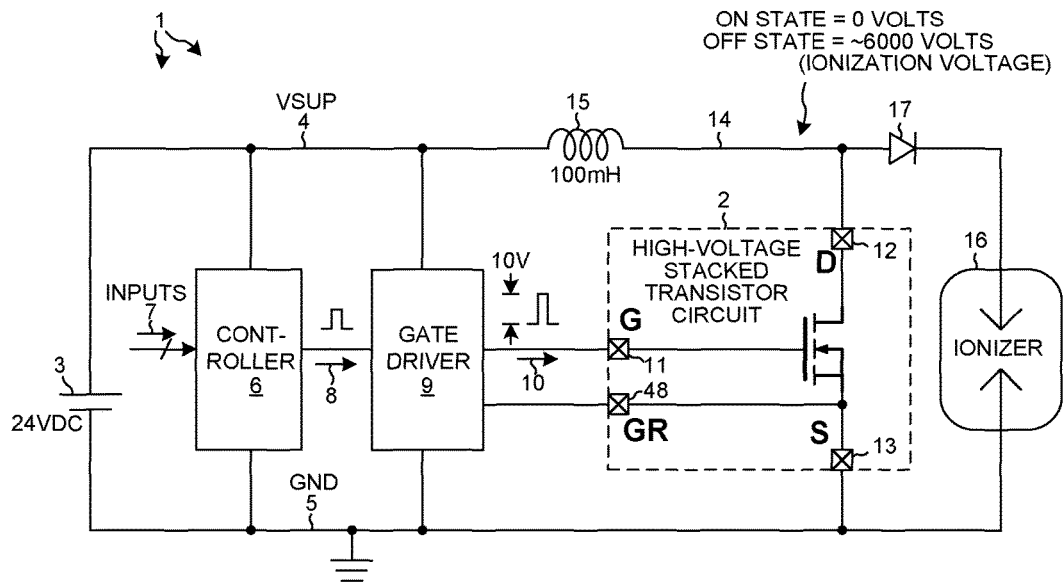
FIG. 1 is a diagram of a system that employs a novel High-Voltage Stacked Transistor Circuit (HVSTC) in accordance with one novel aspect.

FIG. 1 is a diagram of a system 1 that employs a novel High-Voltage Stacked Transistor Circuit (HVSTC) 2. System 1 is but one example of an application circuit that requires a switch that can withstand a very high voltage, such as 6500 volts, between its two switching terminals. The novel HVSTC 2 is such a switch. The novel HVSTC 2, however, also sees use in many other circuits. System 1 of FIG. 1 is but one example.

In system 1, due to DC voltage source 3, 24 volts DC is present on a supply voltage conductor 4 with respect to ground potential on a ground conductor 5. A controller 6 is powered from the DC supply voltage. Based on a plurality of input signals 7 (for example, an air temperature input signal, an air speed input signal, an air pressure input signal, a supply current magnitude input signal, a detected ion flow input signal), the controller 6 supplies a digital on/off signal 8 to a gate driver 9. Gate driver 9 level shifts the signal and generates a level-shifted on/off control signal 10. On/off control signal 10 is supplied onto a control input terminal and input signal conductor G 11 of HVSTC 2. The terminal GR 48 is a gate return terminal to return a reference voltage back to the gate driver 9. If the on/off control signal 10 is at zero volts, then HVSTC 2 is controlled to be off. When HVSTC 2 is off, there is substantially no current flow from the D terminal and conductor 12, through the HVSTC, to the S terminal and conductor 13. If, on the other hand, on/off control signal 10 is at ten volts, then HVSTC 2 is controlled to be on. A current flows from an inductor 15, through node 14 to D terminal and conductor 12, through HVSTC 2, out of S terminal and conductor 13, and to ground conductor 5. After inductor 15 has stored adequate energy, HVSTC 2 is turned off. As a result of HVSTC 2 turning off, the voltage on node 14 spikes upward. There is an air gap in an ionizer 16. When the voltage on node 14 reaches an ionization voltage (for example, 6500 volts), air in the gap is ionized. A burst of current flows from node 14, through diode 17, through ionizer 16, and to ground conductor 5. HVSTC 2 is repeatedly switched on and off so that the ionizer 16 creates a flow of such ionized air. HVSTC 2 from the outside perspective has the appearance and function of a four-terminal packaged power Field Effect Transistor (FET). The four terminals are the source terminal (S) 13, the drain terminal (D) 12, the gate terminal (G) 11, and the gate return terminal (GR) 48. Unlike a conventional packaged FET, HVSTC 2 has a very high $V_{DS}$ breakdown voltage ($BV_{DS}$) in excess of 6500 volts.

Figure 2:
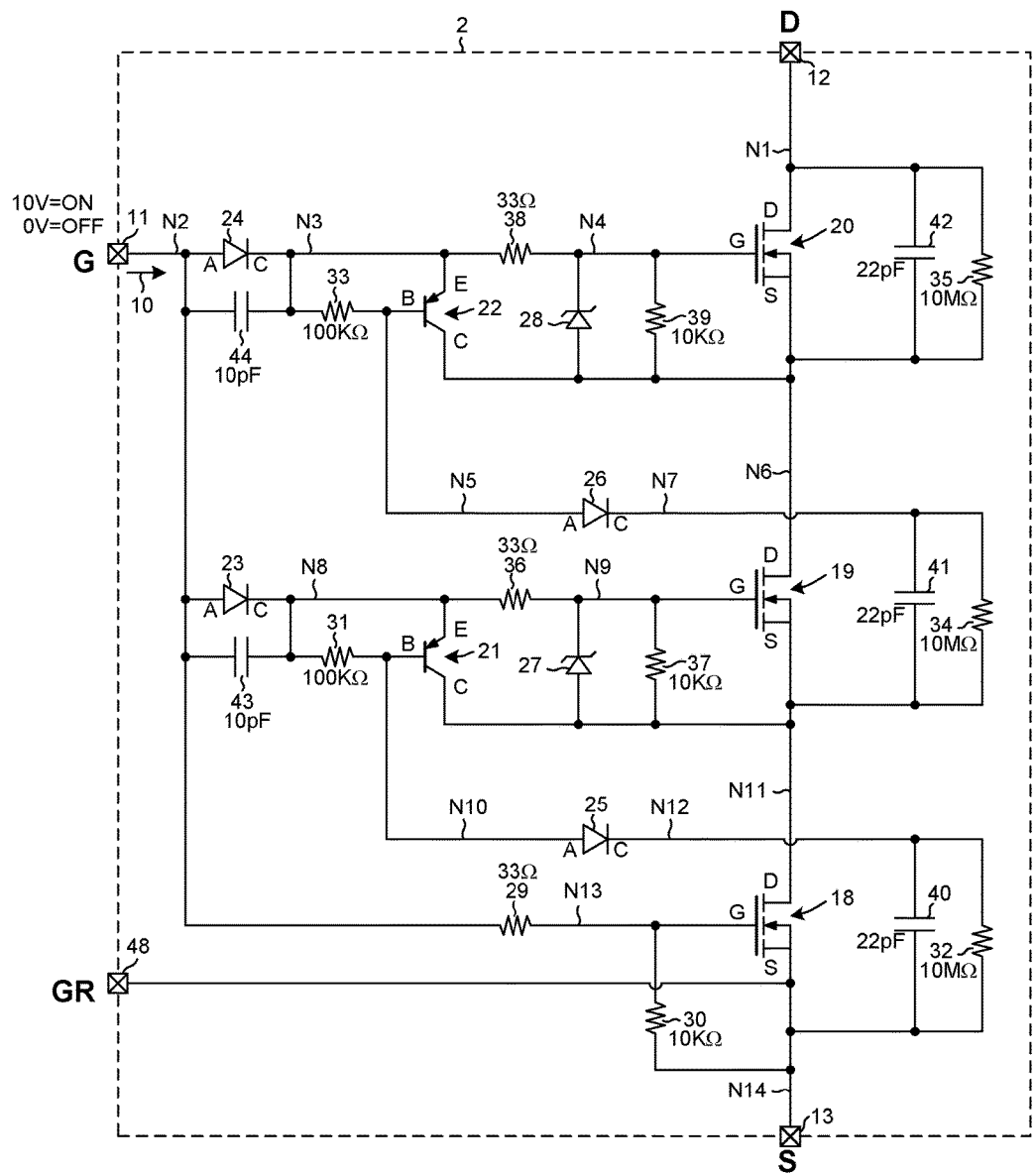
FIG. 2 is a circuit diagram of the HVSTC of FIG. 1.

FIG. 2 is a more detailed diagram of HVSTC 2 of FIG. 1. HVSTC 2 has a drain-to-source $V_{DS}$ breakdown voltage ($BV_{DS}$) between terminals 12 and 13 in excess of 6500 volts even though it involves a stack of three N-channel enhancement-mode power FETs 18-20, each of which has a drain-to-source $V_{DS}$ breakdown voltage ($BV_{DS}$) that is less than 3000 volts. In this case, each of the three FETs 18-20 has a $BV_{DS}$ of about 2500 volts.

HVSTC 2 includes first N-channel enhancement-mode power FET 18, second N-channel enhancement-mode power FET 19, third N-channel enhancement-mode power FET 20, a first PNP 2N2907 bipolar transistor 21, a second PNP 2N2907 bipolar transistor 22, 8 kV signal diodes 23-26, 15 volt 1N4744 Zener diodes 27-28, resistors 29-39, and capacitors 40-44. The nodes N1-N16 in the circuit are designated in FIG. 2 with "N" identifiers.

Figure 3:
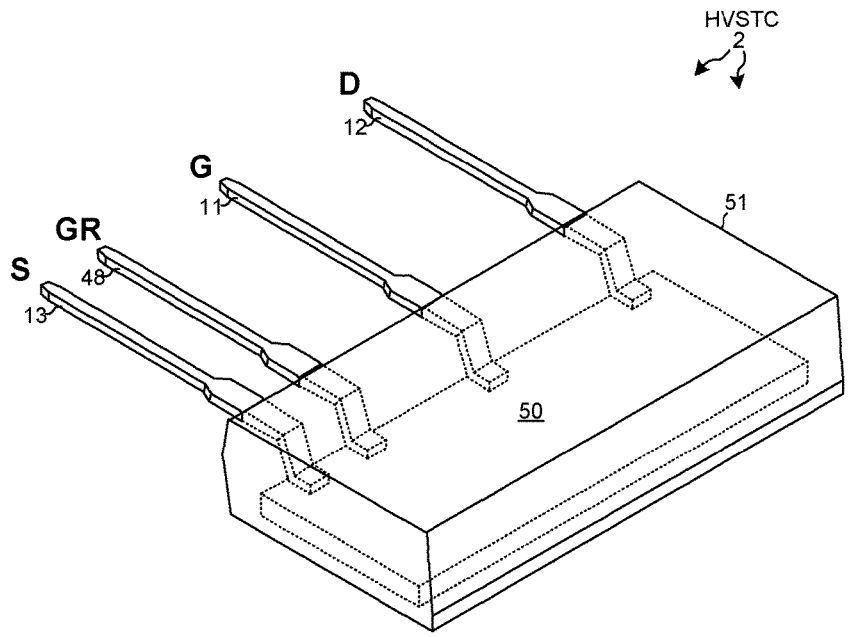
FIG. 3 is a perspective view of the HVSTC of FIG. 1.

FIG. 3 is a perspective diagram of the HVSTC 2. The circuitry of FIG. 2 is disposed on a DCB (Direct Copper Bonded) substrate 50. Each of the four package leads and terminals 13, 48, 11 and 12 is ultrasonically bonded to a corresponding metal island (not shown) of the upper metal layer of the DCB. The components of the circuitry are surface mounted to the top of DCB 50. DCB 50 and the circuitry are then encapsulated in an injection-molded plastic body 51. After leadtrimming and leadforming, the HVSTC 2 appears as illustrated in FIG. 3. The bottom surface of the bottom metal layer of DCB 50 is exposed on the bottom of the body 51 of the package. The package of HVSTC 2, including its DCB and ultrasonically welded terminal leads, can be made as set forth in published U.S. patent application US20130175704, entitled "Discrete Power Transistor Package Having Solderless DBC To Leadframe Attach", filed Jan. 5, 2012, by Gi-Young Jeun et al. (the entire subject matter of which is hereby incorporated by reference).

Figure 4:
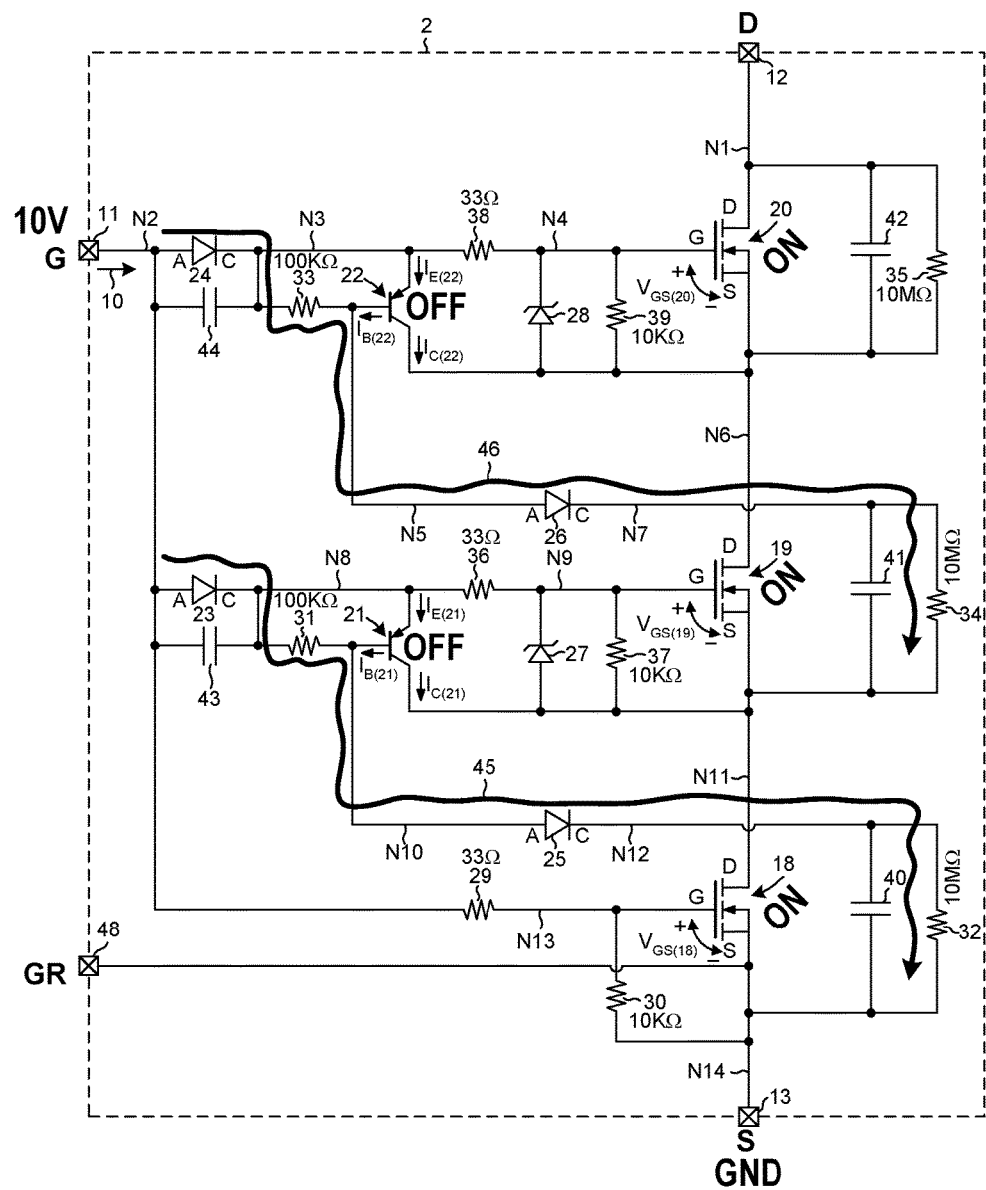
FIG. 4 illustrates an operation of the HVSTC of FIG. 2 in a static on state.

Static on State:

In a "static on state", the three power transistors 18-20 are controlled to be on and conductive. The input signal 10 is at a high voltage level of ten volts. Assume for this explanation that the S lead and terminal 13 is grounded, and that the voltage on the D lead and terminal 12 is approximately zero volts due to conduction through the three power transistors. This situation is illustrated in FIG. 4. In this static condition, there is a current flow from node N2, through forward biased diode 23 to node N8, through resistor 31 to node N10, through forward biased diode 25 to node N12, and through resistor 32 to ground potential at node N14. S terminal and conductor 13 is a part of node N14. This current flow is illustrated by heavy arrow 45 in FIG. 4. The forward bias voltage drop across diode 23 is approximately 0.7 volts, so about 9.3 volts is present on node N8. Resistors 31 and 32 form a resistive voltage divider. Because resistor 31 has a resistance of 100 k ohms and resistor 32 has a much larger resistance of 10 M ohms, the 9.3 volts on node N8 is voltage divided such that far less than 0.7 volts is dropped across resistor 31. Because resistor 31 is coupled between the base and emitter terminals of PNP bipolar transistor 21, the low $V_{BE}$ voltage across transistor 21 keeps transistor 21 off and nonconductive. The 10 volt signal on node N2 is voltage divided by the resistive voltage divider of resistor 29 and resistor 30. Accordingly, the voltage on the gate of power FET 18 is higher than the threshold voltage of power FET 18, so the FET 18 is on and conductive. Because FET 18 is on, a because its source is at zero voltage, the voltage on node N11 is also approximately zero volts. There is also a current flow from node N2, through forward biased diode 24 to node N3, through resistor 33 to node N5, through forward biased diode 26 to node N7, through resistor 34 to the zero voltage at node N11. This current flow is illustrated by heavy arrow 46 in FIG. 4. The forward bias voltage drop across diode 24 is approximately 0.7 volts, so about 9.3 volts is present on node N3. Resistors 33 and 34 form a resistive voltage divider. Because resistor 33 has a resistance of 100 k ohms and resistor 34 has a much larger resistance of 10 M ohms, the 9.3 volts on node N3 is voltage divided such that far less than 0.7 volts is dropped across resistor 33. Because resistor 33 is coupled between the base and emitter terminals of PNP bipolar transistor 22, the low $V_{BE}$ voltage across transistor 22 keeps the transistor 22 off and nonconductive. The 9.3 volts present on node N8 is voltage divided by the resistive voltage divider of resistors 36 and 37, thereby supplying the appropriate high voltage that is higher than the threshold voltage of power FET 19. This high voltage on the gate of power FET 19 keeps power FET 19 on and conductive. Likewise, the 9.3 volts present on node N3 is voltage divided by the resistive voltage divider of resistors 38 and 39, thereby supplying the appropriate high voltage that is higher than the threshold voltage of power FET 20. This high voltage on the gate of power FET 20 keeps power FET 20 on and conductive.

Figure 5:
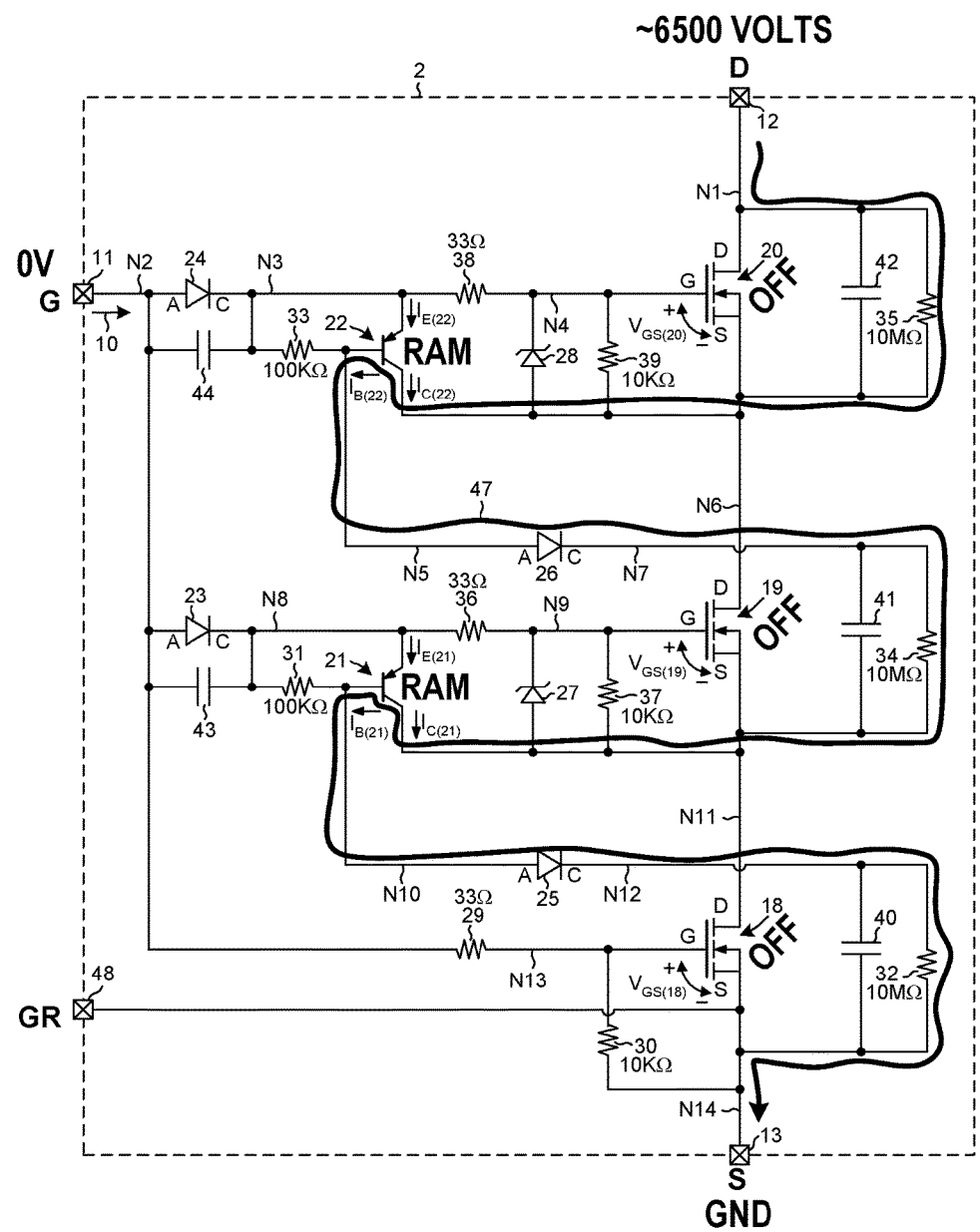
FIG. 5 illustrates an operation of the HVSTC of FIG. 2 in a static off state.

Static Off State:

In a "static off state", the three power FETs 18-20 are controlled to be off and nonconductive. As illustrated in FIG. 5, the input signal 10 is at a low voltage level of zero volts. Assume for this explanation that the S terminal and conductor 13 is grounded, and that the voltage on the D terminal and conductor 12 is a very high voltage of approximately 6500 volts. In this static off condition, each of the bipolar transistors 21 and 22 is operating in its so-called "reverse active mode". The "reverse active mode" is denoted "RAM" in FIG. 5. The PN junction between the base and the collector of the bipolar transistor is forward biased such that current flows into the collector, across the collector-to-base junction, and out of the base. Due to the structure of the bipolar transistor, it has a relatively poor emitter efficiency in this "reverse active mode" as compared to its emitter efficiency when operating in its forward active mode. In bipolar transistor 22, there is very little emitter current $I_{E(22)}$. Therefore $-I_{C(22)}$ is approximately the same as $I_{B(22)}$. Likewise, in bipolar transistor 21, there is very little emitter current $I_{E(21)}$. Therefore $-I_{C(21)}$ is approximately equal to $I_{B(21)}$. A steady current can be said to flow from the D terminal and lead 12, through resistor 35 to node N6, across the collector-to-base junction of bipolar transistor 22 to node N5, through forward biased diode 26 to node N7, through resistor 34 to node N11, across the collector-to-base junction of bipolar transistor 21 to node N10, through forward biased diode 25 to node N12, through resistor 32 to node N14. This current flow is illustrated by heavy arrow 47 in FIG. 5. The bipolar transistor 22, which is on and conductive (albeit in the "reverse active mode"), helps hold the gate-to-source voltage $V_{GS(20)}$ between the gate and source of power FET 20 at about zero volts, and below the threshold voltage of the power FET 20. Likewise, bipolar transistor 21, which is on and conductive (albeit in the "reverse active mode"), helps hold the voltage $V_{GS(19)}$ between the gate and source of power FET 19 at about zero volts, and below the threshold voltage of the power FET 19. Because zero volts is present both on G terminal 11 and on S terminal 13, the voltage on the gate of power FET 18 is held at zero volts. The gate-to-source voltage $V_{GS(18)}$ of power FET 18 is therefore also at about zero volts, and below the threshold voltage of the power FET 18. All three of the power FETs 18-20 are kept off and nonconductive.

Figure 6A:
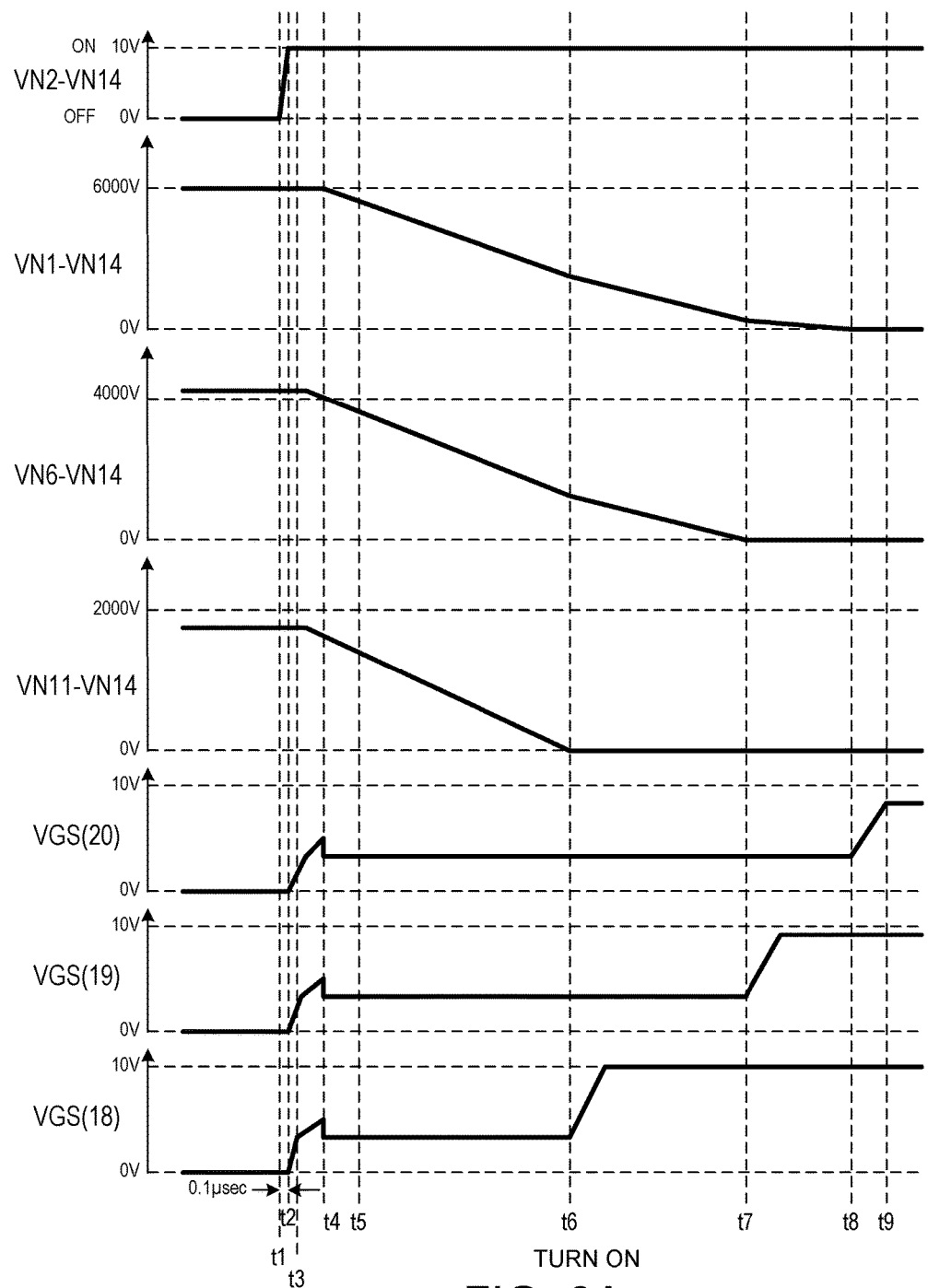
Figure 6B:
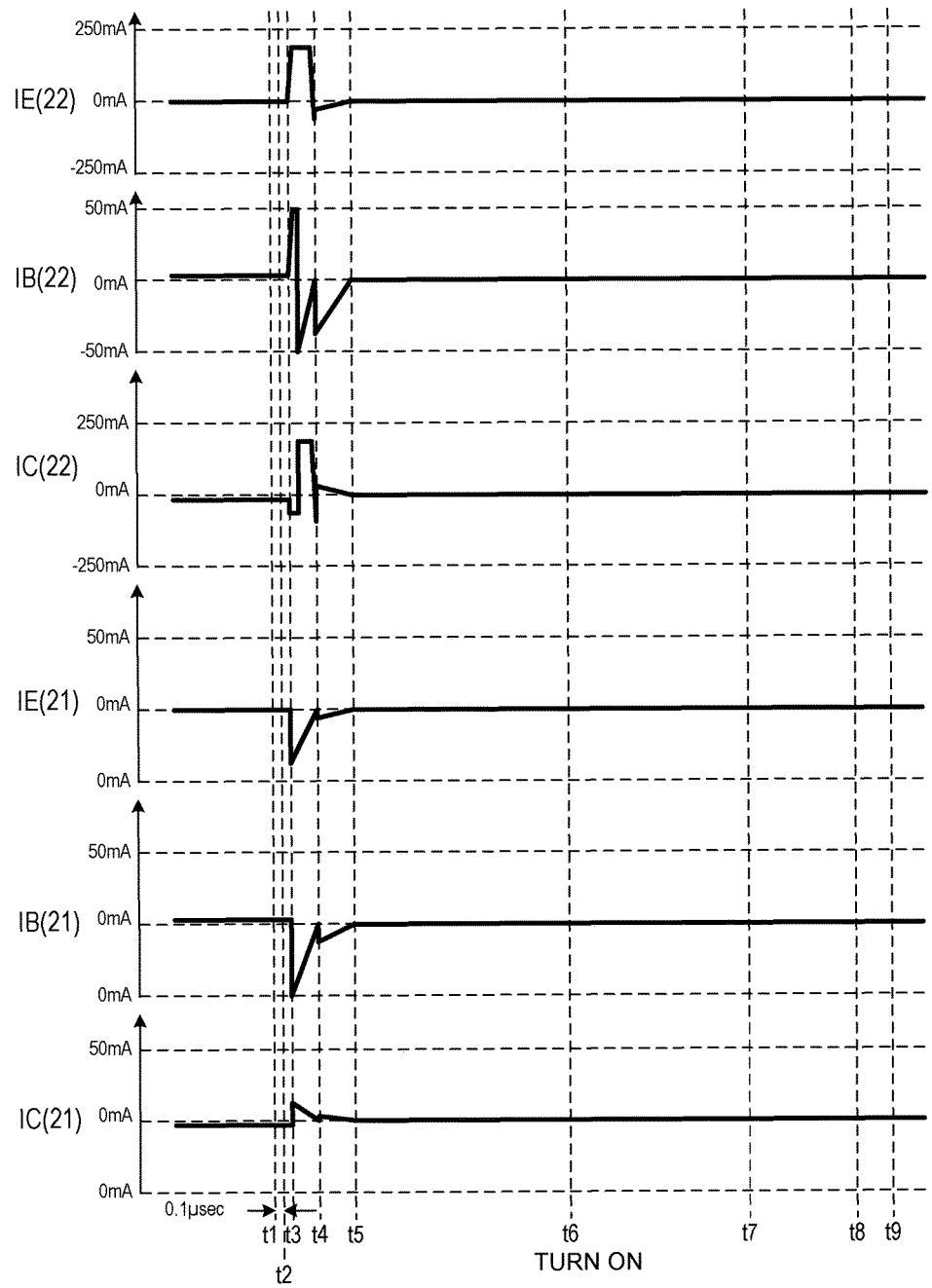

FIG. 6A and FIG. 6B are waveform diagrams that illustrate operation of HVSTC 2 of FIG. 2 when the circuit is turning on (going from the static off state to the static on state). Prior to time t1, the circuit is operating in the static off state. At time t1, the input signal on G terminal 11 is made to transition from zero volts to ten volts. In this example, this signal transition takes about 0.1 microseconds. Starting at time t2, the gate-to-source voltages of the power FETs rise as illustrated in FIG. 6A. At t3, the gate-to-source voltages exceed the threshold voltages of the power FETs, so the drain-to-source voltages of the power FETs start decreasing. These decreasing drain-to-source voltages are evidenced by the decreasing waveforms of VN11-VN14, and VN6-VN14 and VN1-VN14. At time t4, the base currents of the bipolar transistors are negative, which removes stored charge, and this forces the bipolar transistors to be off at about time t5. From about time t5 until about time t8, the decreasing of the drain-to-source voltages of the power FETs stop, one by one. For example, when the voltage VN11-VN14 stops decreasing at time t6, then the gate-to-source voltage of power FET 18 increases and reaches its final ten volt value. When the voltage VN11-VN14 stops decreasing at time t7, then the gate-to-source voltage of power FET 19 increases and reaches its final ten volt value. When the voltage VN1-VN14 stops decreasing at time t8, then the gate-to-source voltage of power FET 20 increases and reaches its final ten volt value. From time t9 onward, the circuit is operating in its static on state.

Figure 7A:
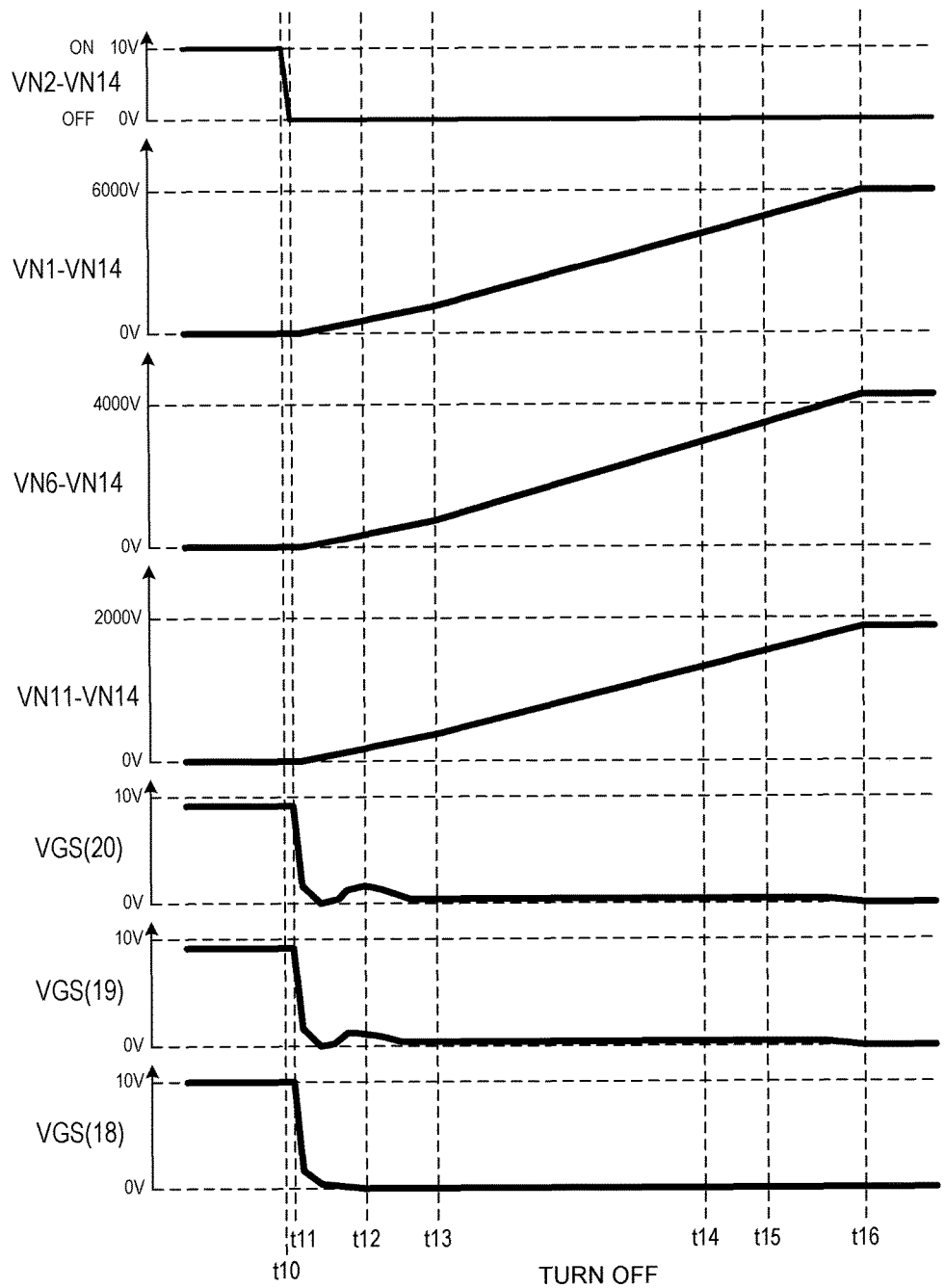
FIG. 7A is a waveform diagram that illustrates operation of the HVSTC of FIG. 2 when the circuit is turning off.
Figure 7B:
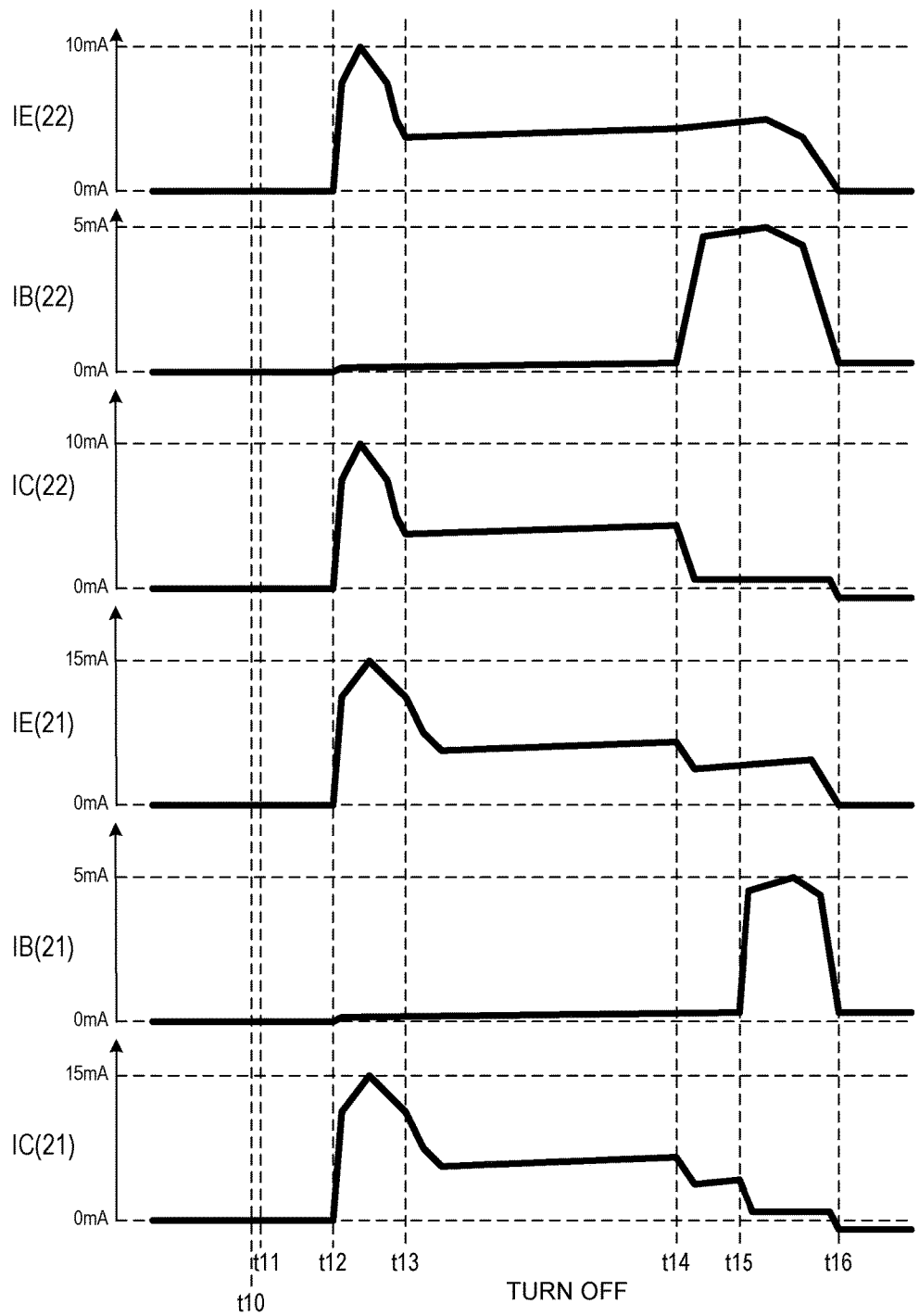
FIG. 7B is a waveform diagram that illustrates operation of the HVSTC of FIG. 2 when the circuit is turning off.

FIG. 7A and FIG. 7B are waveform diagrams that illustrate operation of HVSTC 2 of FIG. 2 when the circuit is turning off (going from the static on state to the static off state). Prior to time t10, the circuit is operating in the static on state. At time t10, the input signal on G terminal 11 is made to transition from ten volts to zero volts. In this example, this signal transition takes about 0.1 microseconds. Starting at time t11, the gate-to-source voltages on the three power FETs decrease as illustrated. The gate-to-source voltages of the two high side power FETs 19 and 20 bounce up again somewhat around time t12 due to Miller capacitances. At time t12, the bipolar transistors begin to operate in their forward active mode of operation. As indicated by the waveforms IE(22), IC(22), IE(21) and IC(21) of FIG. 7B, the collector current waveforms and the emitter current waveforms exhibit overshoot between times t12 and t13. The switching is complicated, but in a simplified explanation the bipolar transistors can be described as operating in their forward active modes between times t13 and t14. Between times t14 and t15, the magnitude of the collector current $I_{C(22)}$ flowing through bipolar transistor 22 becomes small as indicated by the IC(22) waveform, and the magnitude of the base current $I_{B(22)}$ flowing through bipolar transistor 22 becomes relatively large as indicated by the IB(22) waveform. Likewise, between times t15 and t16, the collector current $I_{C(21)}$ flowing through bipolar transistor 21 becomes small as indicated by the IC(21) waveform, and the base current $I_{B(21)}$ flowing through bipolar transistor 21 becomes relatively large as indicated by the IB(21) waveform. By time t16, both bipolar transistors 22 and 21 are operating in the reverse active mode (denoted "RAM" in FIG. 5). From time t16 onward, the HVSTC circuit operates in its static off state.

Figure 8:
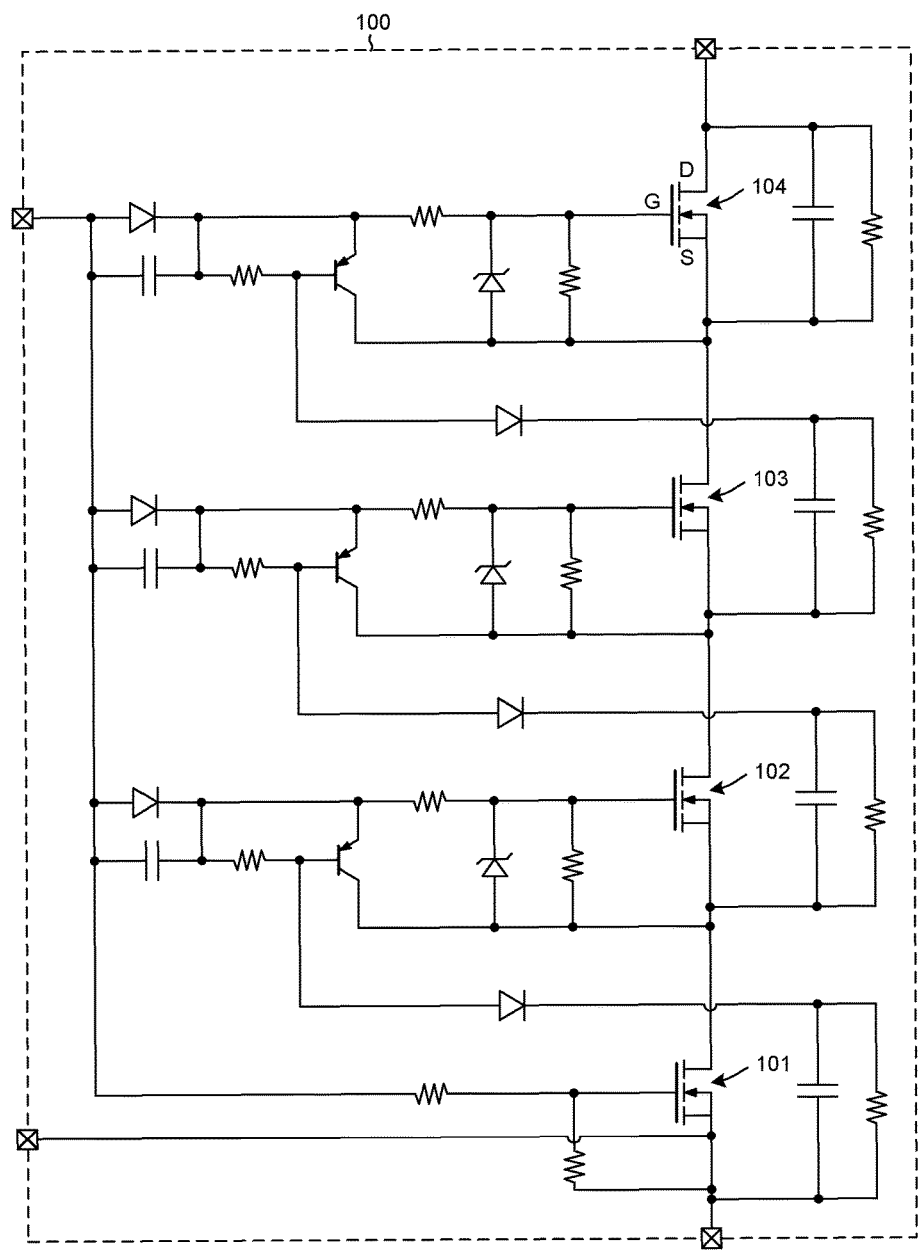
FIG. 8 is a diagram of an HVSTC that involves a stack of four power FETs.

The circuit and technique described above in connection with FIG. 2 can be extended to include a stack of four or more power FETs. For example, FIG. 8 is a diagram of an HVSTC 100 that involves a stack of four power FETs 101-104.

Although certain specific embodiments are described above for instructional purposes, the teachings of this patent document have general applicability and are not limited to the specific embodiments described above. Although examples are set forth above in which the power transistors are power FETs, in other examples the power transistors are power IGBTs (Insulated Gate Bipolar Transistors). Accordingly, various modifications, adaptations, and combinations of various features of the described embodiments can be practiced without departing from the scope of the invention as set forth in the claims.

What is claimed is:

1. An apparatus comprising:
   a first field effect transistor (FET);
   a second FET having a source that is coupled to a drain of the first FET;
   a third FET having a source that is coupled to a drain of the second FET;
   a first bipolar transistor having a collector that is coupled to the drain of the first FET;
   a second bipolar transistor having a collector that is coupled to the drain of the second FET;
   a first diode having a cathode that is coupled to an emitter of the first bipolar transistor;
   a second diode having a cathode that is coupled to an emitter of the second bipolar transistor, wherein an anode of the second diode is coupled to an anode of the first diode;
   a first resistor coupled between the anode of the first diode and a gate of the first FET;
   a third diode coupled between a base of the first bipolar transistor and a source of the first FET; and
   a fourth diode coupled between a base of the second bipolar transistor and the source of the second FET.

2. The apparatus of claim 1, wherein the collector of the first bipolar transistor is coupled to the source of the second FET, and wherein the collector of the second bipolar transistor is coupled to the source of the third FET.

3. The apparatus of claim 1, further comprising:
   a second resistor, wherein the second resistor and the third diode are coupled in series between the base of the first bipolar transistor and the source of the first FET; and
   a third resistor, wherein the third resistor and the fourth diode are coupled in series between the base of the second bipolar transistor and the source of the second FET.

4. The apparatus of claim 3, further comprising:
a fourth resistor coupled between the base of the first bipolar transistor and the emitter of the first bipolar transistor; and
a fifth resistor coupled between the base of the second bipolar transistor and the emitter of the second bipolar transistor.

5. The apparatus of claim 1, further comprising:
a second resistor coupled between the gate of the first FET and the source of the first FET.

6. The apparatus of claim 1, further comprising:
a second resistor coupled between the source of the third FET and a drain of the third FET.

7. The apparatus of claim 1, wherein the emitter of the first bipolar transistor is resistively coupled to a gate of the second FET, and wherein the emitter of the second bipolar transistor is resistively coupled to a gate of the third FET.

8. The apparatus of claim 1, wherein the apparatus has a breakdown voltage between the source of the first FET and the drain of the third FET that is in excess of 6500 volts, wherein the first FET is a power FET having a drain-to-source breakdown voltage that is less than 3000 volts, wherein the second FET is a power FET having a drain-to-source breakdown voltage that is less than 3000 volts, and wherein the third FET is a power FET having a drain-to-source breakdown voltage that is less than 3000 volts.

9. The apparatus of claim 1, wherein the first and second bipolar transistors are PNP bipolar transistors.

10. The apparatus of claim 1, further comprising:
a semiconductor device package, wherein the first FET, the second FET, the third FET, the first bipolar transistor, the second bipolar transistor, the first diode, the second diode, the third diode and the fourth diode are all contained within the semiconductor device package, wherein a first lead of the semiconductor device package is coupled to the anodes of the first and second diodes, and wherein a second lead of the semiconductor device package is coupled to the source of the first FET.

11. A stacked transistor circuit comprising:
an input signal conductor;
a first power transistor;
a second power transistor having a source that is coupled to a drain of the first power transistor;
a third power transistor having a source that is coupled to a drain of the second power transistor;
a first bipolar transistor having a collector that is coupled to the drain of the first power transistor, wherein an emitter of the first bipolar transistor is resistively coupled to a gate of the second power transistor;
a second bipolar transistor having a collector that is coupled to the drain of the second power transistor, wherein an emitter of the second bipolar transistor is resistively coupled to a gate of the third power transistor; and
means: 1) for receiving an input signal from the input signal conductor, 2) for controlling the first and second bipolar transistors not to conduct current in a static on state of the stacked transistor circuit such that the first, second and third power transistors are all on and conductive in the static on state, and 3) for controlling the first and second bipolar transistors to be able to conduct current in a static off state of the stacked transistor circuit such that the first, second and third power transistors will all be off and nonconductive in the static off state.

12. The stacked transistor circuit of claim 11, wherein the collector of the first bipolar transistor is directly coupled to the source of the second power transistor without any intervening resistor component, and wherein the collector of the second bipolar transistor is directly coupled to the source of the third power transistor without any intervening resistor component.

13. The stacked transistor circuit of claim 11, wherein the means comprises:
a first diode having a cathode that is coupled to an emitter of the first bipolar transistor;
a second diode having a cathode that is coupled to an emitter of the second bipolar transistor, wherein an anode of the second diode is coupled to an anode of the first diode;
a first resistor coupled between the anode of the first diode and a gate of the first power transistor;
a third diode coupled between a base of the first bipolar transistor and a source of the first power transistor; and
a fourth diode coupled between a base of the second bipolar transistor and the source of the second power transistor.

14. The stacked transistor circuit of claim 11, wherein the means controls the first and second bipolar transistors to be off in the static on state of the stacked transistor circuit.

15. The stacked transistor circuit of claim 11, wherein the means controls the first and second bipolar transistors to be in a reverse active mode in the static off state of the stacked transistor circuit.

16. The stacked transistor circuit of claim 11, wherein the means controls the first bipolar transistor to be able to conduct current from its collector to its base in the static off state of the stacked transistor circuit, and wherein the means controls the second bipolar transistor to be able to conduct current from its collector to its base in the static off state of the stacked transistor circuit.

17. The stacked transistor circuit of claim 11, further comprising:
a semiconductor device package, wherein the first power transistor, the second power transistor and the third power transistor are contained within the semiconductor device package, and wherein a first lead of the semiconductor device package is coupled to the input signal conductor.

18. The stacked transistor circuit of claim 11, wherein the first bipolar transistor and the second bipolar transistor are PNP bipolar transistors.

19. The stacked transistor circuit of claim 11, wherein the first power transistor is a power enhancement-mode Field Effect Transistor (FET), wherein the second power transistor is a power enhancement-mode FET, and wherein the third power transistor is a power enhancement-mode FET.

20. The stacked transistor circuit of claim 11, wherein the stacked transistor circuit has a breakdown voltage between a source of the first power transistor and the drain of the third power transistor that is in excess of 6500 volts, wherein the first power transistor has a drain-to-source breakdown voltage that is less than 3000 volts, wherein the second power transistor has a drain-to-source breakdown voltage that is less than 3000 volts, and wherein the third power transistor has a drain-to-source breakdown voltage that is less than 3000 volts.

* * * * *